United States Patent
Snodgrass et al.

[11] Patent Number: 6,092,937
[45] Date of Patent: Jul. 25, 2000

[54] LINEAR DEVELOPER

[75] Inventors: Ocie T. Snodgrass, Garland; Gregory M. Gibson, Dallas; Carl W. Newquist, Plano, all of Tex.

[73] Assignee: FAStar, Ltd., Dallas, Tex.

[21] Appl. No.: 09/227,362

[22] Filed: Jan. 8, 1999

[51] Int. Cl.[7] ............................... G03D 5/04; B65D 3/00
[52] U.S. Cl. .................. 396/611; 396/571; 396/578; 396/627; 427/560; 430/3; 134/902
[58] Field of Search ..................... 396/604, 611, 396/625, 626, 627, 571, 576, 578; 430/3; 134/902; 427/560, 600, 240, 385.5; 118/52

[56] References Cited

U.S. PATENT DOCUMENTS

| | | | |
|---|---|---|---|
| 4,633,804 | 1/1987 | Arii | 396/611 |
| 4,696,885 | 9/1987 | Vijan | 430/311 |
| 5,309,191 | 5/1994 | Bartell et al. | 354/299 |
| 5,625,433 | 4/1997 | Inada et al. | 396/604 |
| 5,626,913 | 5/1997 | Tomoeda et al. | 427/299 |
| 5,689,749 | 11/1997 | Tanaka et al. | 396/611 |
| 5,762,745 | 6/1998 | Hirose | 396/611 |
| 5,815,762 | 9/1998 | Sakai et al. | 396/611 |
| 5,845,170 | 12/1998 | Ogata | 396/604 |
| 5,858,475 | 1/1999 | Chiu | 427/560 |
| 5,960,225 | 9/1999 | Fujimoto | 396/611 |
| 5,984,540 | 11/1999 | Mimasaka et al. | 396/604 |

*Primary Examiner*—Alan A. Mathews
*Attorney, Agent, or Firm*—Fulbright & Jaworski L.L.P.

[57] ABSTRACT

The inventive dispenser mechanism uniformly develops a photosensitive layer on a substrate. The mechanism uses a developer head that moves in a substantially linear relative motion with respect to the substrate and dispenses a developer at a controlled rate. Contact of the developer material with the photosensitive layer commences a chemical reaction of developing. The mechanism also uses a rinse head that has the same motion as the developer head and travels at the same velocity. The rinse head dispenses a rinse material at a controlled rate. Contact of the rinse material with the developer material on the photosensitive layer retards the chemical reaction of developing. The rinse head waits for a predetermined dwell period after the developer head has dispensed the developer material before dispensing the rinse material. The mechanism may also use a suction head that has the same motion and velocity and removes loose material on a surface of the substrate.

48 Claims, 4 Drawing Sheets

LINEAR DEVELOPER

RELATED APPLICATIONS

This application claims the benefit of U.S. Provisional Application Serial No. 60/070,971 filed Jan. 9$^{th}$, 1998, entitled "LINEAR DEVELOPER" the disclosure of which is incorporated herein by reference.

The present application is also related, and reference hereby made, to concurrently filed, co-pending, and commonly assigned patent applications: Ser. No. 09/227,667 entitled "MOVING HEAD, COATING APPARATUS AND METHOD"; Ser. No. 09/227,381 entitled "SYSTEM AND METHOD FOR CLEANING AND PRIMING AN EXTRUSION HEAD"; and Ser. No. 09/227,459 entitled "SYSTEM AND METHOD FOR ADJUSTING A WORKING DISTANCE TO CORRESPOND WITH THE WORK SPACE", the disclosures of which applications are incorporated herein by reference.

The present application is also related, and reference hereby made, co-pending, and commonly assigned patent applications: Ser. No. 09/148,463 entitled "LINEAR EXTRUSION COATING SYSTEM AND METHOD".

TECHNICAL FIELD

The present invention relates to liquid coating methods and apparatus, and more particularly to the process of applying a developer to a photoresist.

BACKGROUND

In the manufacture of printed circuit boards or integrated circuits, it is often required to apply a liquid coating to the surface of substrates of various forms including circuit boards, or IC wafers (IC) and flat panel displays (FPDs) In manufacturing printed circuit boards, a photoresist is used to outline the circuit structure onto the copper surface of the board. This is traditionally done by exposing certain segments of the photoresist to ultraviolet radiation using a mask which outlines the circuit structure. The ultraviolet radiation hardens the exposed photoresist. The remaining unexposed photoresist is then washed off. An etchant is then applied to the circuit board which etches off all the copper surfaces that are not protected by the hardened photoresist. The exposed photoresist is then stripped away exposing the copper circuit lines underneath. FPDs use a similar process, however the copper layer is not present and the FPD features have a smaller geometry than circuit boards.

Typically, a number of different layers are applied to a substrate to properly develop the surface of the substrate. Photosensitive chemicals are applied by a variety of methods and then typically baked off to dry the solvents creating a photosensitive film. This film is then exposed to UV (ultraviolet) having a wavelength which can vary depending upon the sensitivity of the material. The UV light is usually transmitted to the film employing a patterning device such as a stepper, scanner, or mask aligner to expose selected portions of the photosensitive coating. The next step is to develop the exposed portion of the film. In this case the "film" is a variety of photoresist.

Developing involves contacting the exposed film or surface with one or more of a variety of different chemicals depending on the type of photoresist used. Use of positive photoresist yields a positive image of the stencil employed in the mask or patterning device, and use of negative photoresist yields a negative of this image. Although different chemicals are employed for developing the different types of photoresist the mechanism for developing is similar.

Prior art methods for accomplishing the developing process include spin developing and use of a dip tank or batch developing. Both methods experience problems which are discussed below.

Spin developing involves placing a substrate on a turntable or other rotating mechanism and applying developer either by dispensing developer onto the center of the substrate thereby causing the fluid to spread out across the substrate through the spinning action, or by spraying developer directly onto the surface of the substrate. The velocity of rotation can be set such as to spread out the developer as evenly as possible and ultimately increased to the point where some loose unreacted developer is forced off the substrate by centrifugal force.

A rinsing process follows the application of developer fluid and is pursued in much the same manner. Rinsing fluid is applied either to the center of a rotating substrate or sprayed on the substrate as with the developer. Rotation velocity of the substrate can be adjusted initially to spread out the rinsing fluid and later increased to the point where the rinsing fluid is forced off the substrate. The rinsing fluid performs three main functions upon being spread around the substrate: it stops the chemical reaction induced by the developer fluid, and acts to wash away unused or unreacted developer. The rinse fluid also helps to wash away "developed" or removed material. The quality and uniformity of the developing process depends, among other things, upon the reaction time between the developer and the photoresist, or other film, and the consistency in this reaction time across the substrate being developed.

A drawback to spin developing is non-uniformity of the development process. It is difficult to ensure even distribution of the developer and rinse fluids and exposure time using spin developing and therefore difficult to achieve uniform develop results on the surface of the substrate. In practice, it has been observed that substrates are usually over-developed toward the outside or outermost perimeter of substrates. Therefore it is a problem in the art that spin coating does not provide for uniform developing of substrates. Spin developing also requires dispensing a substantial quantity of fluid which may never contribute to the developing process, such fluid having been either spun off the substrate before having had a chance to react.

Another drawback to spin developing, particularly for very large substrates, is the significant centripetal forces that are encountered, which can damage certain microscopic structures on the substrate (particularly high aspect ratio features (tall and skinny)).

Another prior art method for developing substrates is batch developing, wherein an entire substrate is dipped into a bath of developer fluid for a prescribed period of time and subsequently into a rinse bath or series of rinse baths. For any given substrate, there may be some improvement in developing consistency across that substrate as compared with spin developing However, the process as a whole suffers from the fact that the submersion of a substrate into the developer bath leaves material in the bath and partially contaminates that bath. This contamination effect progresses with each successive substrate thus making the developer less and less effective with succeeding substrate. Consistency from one substrate to another will therefore not be consistent. It is therefore a problem in the art that batch developing causes inconsistencies between successive substrates developed using the same developer bath.

Therefore it is a problem in the art that the distribution of developer across the surface of a substrate is not even when spin developing.

It is a further problem that chemical reaction time between developer fluid and the substrate is not even across the surface of a substrate when spin developing.

It is a still further problem in the art that the extent of chemical reaction between the developer and film on the substrate is not uniform when spin coating.

It is a still further problem in the art that there is inconsistency in developing between successive substrates developed using the same baths of developer and rinse fluids.

It is a still further problem in the art that centripetal forces during spin developing can damage some of the microscopic features present on the substrate.

SUMMARY OF THE INVENTION

These and other objects, features and technical advantages are achieved by a system and method which applies developer directly to a substrate using linear motion between the substrate to be developed and a head or plurality of heads, or devices, for performing operations on the substrate.

In a preferred embodiment, various heads carrying the different fluids pass over a stationary substrate supported by a chuck. Alternatively, the various heads could be stationary, and a moving chuck could carry the substrate underneath the heads which perform various operations on the substrate. A still further alternative involves employing a combination of motion of the chuck and substrate and of the heads to accomplish the required relative motion between the substrate and the heads performing operations on the substrate.

In a preferred embodiment, the inventive mechanism performs certain basic operations on the substrate including dispensing developer fluid, then applying vacuum to, sucking up, suctioning up or removing developer material, dispensing rinse fluid onto the substrate, and sucking up, or removing the rinse fluid. There are various ways of distributing these functions among the available hardware.

In a preferred embodiment, one dispensing head or extrusion head is dedicated to the operation of dispensing developer, or developer fluid, onto the substrate. This head moves with respect to the substrate independently of other hardware which performs operations on the substrate, such as the suction head or rinsing head.

In a preferred embodiment, a second structure comprises hardware for sucking up excess fluid, either developer, rinse fluid, or a combination of the two, as a head for dispensing or extruding rinse fluid onto the substrate. In this embodiment, the suction head and rinse heads are fixed with respect to one another and, of course, move over the substrate at the same time and at the same velocity with respect to the substrate.

In an alternative embodiment, the developer head, suction head, and rinse head may all be fixed onto a single structure and move in unison over the substrate. In still other embodiments, the three heads may all be physically independent of one another and also move with respect to the substrate independently of the other heads. Various permutations of attachment of the heads to each other may be implemented without departing from the scope of the present invention.

In a preferred embodiment, one gantry structure carries the developer head and an independent gantry structure carries a structure comprising a suction head and rinse head. Alternatively, a single gantry structure could carry the developer head and suction/rinse structure even though relative motion between the developer head and suction/rinse structure is available within the single gantry structure.

In a preferred embodiment, a developer dispensing or extrusion head approaches a substrate having an exposed photosensitive layer, and is then moved over the substrate at a predetermined and constant velocity while dispensing developer fluid at a constant rate, thereby completely and uniformly covering the substrate with developer fluid. It is noted that the photosensitive layer or film could be one of many substances including positive or negative photoresist. The invention therefore presents the advantage that the substrate is evenly covered with developer fluid. Depending upon either a recipe driven formula based on experience gathered about a particular developer or particular type of photosensitive layer, or based upon feedback from sensors such as a vision system, additional developer deposition operations may be required, or the mechanism can decide to proceed with the next operation.

In a preferred embodiment, the inventive mechanism then waits a predetermined dwell time during which the developer fluid chemically reacts with the photosensitive layer. The duration of this dwell time may be varied depending upon a number of factors including but not limited to the developer fluid temperature, the ambient air temperature, the substrate temperature, the chemical strength of the developer fluid, the level of ultrasonic energy, the velocity of developer head movement, and optionally, the estimated amount of developing needed. In an alternative embodiment, the inventive mechanism could immediately proceed with the next operation. Preferably a dwell time of 10 to 30 seconds is employed.

In a preferred embodiment, the mechanism then moves a second structure comprising a suction head and rinse head over the substrate at a constant velocity which is the same as the velocity at which the developer head was moved over the same substrate, with the suction head leading the rinse head. The suction head passes very close to the substrate surface applying suction to the substrate surface, preferably at the same suction level, or negative pressure level across the substrate, thereby removing from the substrate, material comprising unreacted developer fluid along with products of chemical interaction between the developer and the photosensitive layer. The suction head continues the action of vacuum removal of loose fluid matter throughout the length of the substrate.

In an alternative embodiment, the suction and rinse heads may be physically independent of each other, or both physically attached to the developer head as well as to each other.

In a preferred embodiment, the rinse head follows a fixed distance behind the suction head and dispenses rinse fluid onto the substrate, preferably at a constant rate throughout the head's travel along the substrate. Where the photosensitive layer is positive photoresist, the rinse fluid is preferably de-ionized water (DI) Contact between the rinse fluid and the substrate both carries away loose material, and essentially neutralizes (arrests) any chemical activity of the developer with the photosensitive layer. Note that several passes may be required to halt the chemical activity. An important contributor to uniformity in developer action across the substrate is the consistency of the suction/rinse head velocity with the developer head velocity, and the constancy of each of the two head velocities throughout their travel across the substrate.

With the velocities of the respective heads subject to the stated constraints, and with all operations starting on the same end of the substrate, the entire substrate surface will be exposed to developer for the same period of time. This is because the area on the substrate first exposed to developer will be the area first exposed to rinse fluid and the area last exposed to developer, the last exposed to rinse fluid, with all intermediate areas on the substrate accordingly receiving rinse fluid in the same order in which they received developer. In addition to the travel time of the developer head and the suction/rinse head, the chemical reaction time includes the dwell time which is inherently the same for all areas on the substrate. Therefore, the combination of employing the same velocity for both operating heads with this velocity held constant throughout the travel of both heads, and a "first developed first rinsed" process sequence, a uniform develop time for the entire substrate results. It is therefore a technical advantage of the invention that all areas of a substrate are exposed to developer for the same period of time.

Holding head travel velocities constant for operations pertaining to successive substrates placed on the chuck is possible but not necessary. If a succession of substrates have the same characteristics, it will likely be desirable to maintain the head velocities the same for the successive developing, suction, and rinsing operations thereby extending the uniformity previously mentioned for a single substrate, to a succession of substrates. If, however, the substrates to be treated differ in their dimensions or chemical nature, the inventive mechanism can change the single velocity at which all the substrate operation heads (developer, suction, rinse) move. It is still the case that the substrate operation heads would all move at the same velocity for any one substrate.

Although, in the preferred embodiment of the present invention, it is an advantage of the present invention for the developer, suction, and rinse heads to travel across the substrate starting at the same end, going in the same direction, at the same constant velocity, alternative embodiments may vary this arrangement and still be within the scope of the present invention. Depending upon the nature of the photosensitive layer, the developer, and other process parameters (including developer chemical strength, and developer temperature), and in general, the tolerance of the chemical reaction for variations in reaction time, it may be possible to have the various heads travel across the substrate starting at opposite ends, and travel at different velocities, in spite of the resulting variation in developer reaction time.

In a preferred embodiment, the suction and rinse processes are performed in a number of iterations to ensure that all developer material and reacted material is either removed by suction from the substrate, or is directed into an overflow trough on the chuck. The last iteration of the rinse/suction head or suction/rinse head is purely a suction-removal operation. Determination of when the substrate is ready for this last "remove-only" operation may be recipe driven, based on experience as to how many iterations of the process are required, or alternatively, may be based on feedback from a vision or other sensory feedback system indicating the substrate's current condition.

In a preferred embodiment, a camera is mounted fixed with respect to the chuck, oriented so as to view the surface of the substrate. A template, or video test pattern, representing a desired end condition of the substrate for the remove and rinse operation is stored in control means connected to the camera and to the remove and rinse head. In this embodiment, the camera views the substrate surface after each iteration of the remove and rinse head, and transmits sensory information representing the current state of the surface to the control means. If the surface matches the condition for performing the last suction/removal operation, that operation is performed. If this match is not found, the system continues with a combination suction and rinse operation. Note that the camera is also used for feedback during the develop process.

This scheme continues until the condition for the last suction operation is satisfied and the final suction operation performed. A feature permitting the fixed camera configuration to be feasible is the uniformity of the develop, suction, and rinse processes. The present invention ensures that a high degree of uniformity will exist with respect to the deposition of develop and rinse fluid and the removal thereof. Accordingly, the condition of a single point on the substrate can reasonably be interpreted to represent the condition of the substrate as a whole.

In an alternative embodiment, the camera can be mounted on the suction/rinse head or other movable mechanism thereby enabling the camera to view the condition of the substrate surface over a broad area instead of a single point. The movement of the camera may comprise a single dimension or a plurality of dimensions from two to six, counting angular dimensions. In this embodiment, the camera can view the substrate during the remove and rinse passes and help determine, in-process (during the actual removal and rinsing operations), if the substrate surface is ready for a final removal operation. Once this final condition is detected, the system proceeds to make one final pass over the substrate using the suction/rinse structure, but using only the suction feature.

In a preferred embodiment of the present invention, a height adjustment mechanism is employed to ensure that the operating heads accurately maintain a finely controlled and minimal height above the substrate without ever actually touching the substrate surface.

While height adjustment is helpful for the developer and rinse heads, it is more important for the suction head, as effective operation of the suction head requires that the vacuum force be applied accurately to a fluid surface above the solid substrate and minimize the input of any air from the sides which could result from the suction head being placed too high above the fluid layer on the substrate.

In a preferred embodiment of the invention, one or more mechanisms for catalyzing, enhancing, or energizing the chemical reaction between the developer and the photosensitive film are employed. One or more air tubes may be deployed behind the developer dispenser which point into the fluid layer dispensed or extruded onto the substrate surface by the developer head. The air tubes would blow air at a selectable velocity toward the fluid layer to agitate the fluid thereby expediting chemical activity within the fluid. Another catalysis option involves directing an inert fluid toward the fluid layer to similarly agitate the fluid. A small volume of fluid would be used so as not to dilute the solution on the substrate surface, but the velocity would be adjusted so as to generate turbulence in the fluid layer, and thereby expedite the chemical reaction between the developer and the photosensitive layer.

A still further option for catalysis involves directing ultrasonic energy toward the fluid layer on the substrate. The required ultrasonic energy may be generated from within the chuck and thereby vibrate the substrate itself. Alternatively, one or more of the heads moving with respect to the substrate could generate ultrasonic energy and transmit such energy via a continuous fluid stream to the point of chemical interaction on the substrate. The required energy could be transmitted by the developer head along the developer fluid stream, and/or by the rinse head along the rinse fluid stream.

It is an objective the present invention, including the cases where catalysis of the chemical reaction is used, to ensure uniformity across the substrate of the reaction variables such as reaction time, reaction intensity, agitation, temperature, and catalyzing action whether air, fluid or ultrasonic.

In a preferred embodiment, the developer head is connected to fluid supply and pump which operates continuously thereby generating developer recirculation along a closed loop path. There is preferably one inlet to and one outlet from the dispensing head thus completing a fluid recirculation path from and to a fluid supply. Control of various system aspects of the fluid such as temperature, and material consistency and purity are aided by such a scheme. Recirculation also acts to prevent problems such as bacteria growth which can result from stagnant fluid. Preferably, the recirculation temporarily stops during the dispensing or extrusion operation. Alternatively, this recirculation flow continues even when the developer head is dispensing fluid onto a substrate.

In a preferred embodiment, the flow path of the fluid through the developer head and associated elements in the developer fluid recirculation path are of constant cross section geometry. It is beneficial to avoid bottlenecks in fluid flow which can cause pressure changes, and fluid flow velocity changes further causing changes in temperature in the developer.

In a preferred embodiment, the developer fluid temperature is closely controlled. Chemical reaction speed is heavily dependent on temperature and, therefore, maintaining constant chemical reaction intensity and reaction speed on the substrate requires that the temperature of the developer be tightly controlled. Temperature control of the chuck and substrate is also desirable and is discussed later.

In a preferred embodiment, temperature control of the developer fluid is achieved by running developer fluid through a central tube of appropriate non-metallic material and cross-sectional geometry, and encircling this developer tube with a second tube containing temperature control fluid which is isolated from any direct contact with the developer. Precisely temperature controlled water or other fluid is then circulated through the outer tube. Transfer of thermal energy between the inner and outer fluid passages helps ensure that the developer fluid will remain as close as possible to the temperature of the outer, temperature control fluid. The temperature control fluid is not subject to the same restrictions as the developer fluid with respect to the materials with which it may make contact, the flow velocities permitted, and the cross sectional geometries through which it may pass, and therefore, more aggressive action may be taken to bring the outer flow or temperature control fluid into conformity with the required temperature.

Various alternative embodiments exist for effecting heat transfer between the developer fluid and the temperature control fluid including, but not limited to deploying fins or other protrusions of non-metallic material into the developer flow path which are in communication with the temperature control fluid to aid in heat exchange, having the temperature control fluid flow in the inner tube and the developer fluid in the outer tube, and deploying heat exchange fins in the temperature control fluid path. Other alternatives include using non-fluid means for temperature control such as disposing externally controlled heating and/or cooling transducers along the exterior of the developer flow path tube or other fluid container. There are many heat exchange mechanisms which can be implemented which do not depart from the scope of the present invention.

In a preferred embodiment, the flow path of the developer fluid within the developer head and attached fluid componentry is entirely non-metallic. The chemical strength and purity of the developer is best preserved if the developer has no opportunity to interact with metallic surfaces before being deposited on a substrate. Acceptable materials include, but are not limited to Teflon, polypropylene, and various types of plastic (both fluorinated and non-fluoridated).

In a preferred embodiment of the present invention, control of the rate of developer dispensing or extrusion onto the substrate is aided by a controllable orifice size in the developer head. The orifice size can be opened to various sizes depending upon the characteristics of the developer currently in use, the recirculation flow rate within the developer fluid path, the temperature of the developer fluid, and the demands of the reaction with the substrate currently being treated.

In a preferred embodiment of the present invention, the characteristics of the rinse fluid flow path mimic those of the developer head. Specifically, the rinse fluid would continuously recirculate through a fluid path comprising the head, a pump, a fluid reservoir and required fluid connection equipment. Note that depending on the process, the rinse fluid may or may not have the same requirements for temperature control as the developer. Further, the flow path for the rinse fluid would be completely non-metallic to avoid any undesired effect on the chemical strength or material purity of the rinse fluid. The rinse fluid path preferably comprises temperature control means such as that described for use with the developer head for ensuring constant rinse fluid temperature within the recirculating flow path as well as at the moment of deposition onto to the substrate. In an alternative embodiment, the rinse fluid flow path may comprise some variation in cross sectional flow geometry and may omit temperature control of the rinse fluid.

In a preferred embodiment, the suction head comprises one or more suction tubes or chambers shaped so as to remove fluid from the substrate without contacting or disturbing the photosensitive film on the substrate. The level of vacuum or negative pressure is sufficient to remove fluid from the substrate but not at a level which will deform or remove material from the photosensitive film. Fluid and other material removed from the substrate surface is preferably deposited in a reservoir for subsequent recycling and recovery.

In a preferred embodiment, the chuck supporting the substrate comprises one or more gantry structures or other moving means for moving the various heads across the substrate. Alternatively, the chuck may comprise means for moving a substrate with respect to stationary heads. Preferably, the chuck comprises stations for storing the heads on both ends of the chuck permitting a head to be dropped off at one end of a substrate, and another head to be picked up by a gantry structure before moving back down the substrate in the other direction. Alternatively, the chuck may have stations for the heads at only one end of the chuck.

In a preferred embodiment, the chuck comprises sensing means for measuring the condition of the developing, suction, and rinsing operations. The sensory information is fed to a control system for the purpose of making various decisions including but not limited to deciding when to complete a suction and rinse procedure, deciding whether a sufficient amount of developing fluid has been deposited on a substrate, and deciding when all operations are complete indicating that a substrate is ready to be removed from the chuck. The possible sensors include, but are not limited to vision systems.

In a preferred embodiment, the chuck comprises means for maintaining the temperature of the chuck, substrate, photosensitive layer and fluid placed upon this layer, thereby enabling accurate control of the chemical reaction on the substrate. This chuck temperature control thereby acts to further the same objective as temperature control in the developer and rinse heads accomplishes.

In an alternative embodiment, temperature control of the chuck and of the fluid in the rinse and developer heads may be jointly implemented. Such joint temperature control may be accomplished by using temperature control fluid lines in common between the chuck and the fluid flow paths of the rinse and developer heads, and precisely controlling the temperature of the temperature control fluid.

In a preferred embodiment, the chuck comprises a height control mechanism in addition to, or as an alternative to, any height control mechanism in the moving means which moves the heads with respect to the substrate. A height control mechanism in the chuck permits the chuck to adjust its height precisely based upon detected variations in the relative height of the various heads with respect to the substrate as the head travels along the length of the substrate.

In a preferred embodiment, the chuck comprises an overflow drain trough to collect excess fluid and other loose matter which gathers on the substrate and flows off the substrate surface along various flow paths. Under ideal operation of the system, very little fluid would gather in this overflow drain trough, however it would be available to gather what small amount of fluid does flow off the substrate surface.

It is noted here that holding constant as many process variables or parameters as possible, such as travel velocity, reaction time, substrate and fluid temperatures (developer and rinse) permits certain other process parameters to vary and still produce an acceptable end product. The parameters which may vary are provided with what is called a wider process window. These parameters are typically those over which the apparatus has no control, such as the chemical strength of the developer, the purity of the rinse fluid, and the material characteristics of the substrate and photosensitive film. Without holding controllable parameters within a tight range, moderate variation of the uncontrolled parameters just listed, which is tolerable when using the present invention, would produce unacceptable parts using prior art systems.

Therefore, it is a technical advantage of the present invention that the distribution of developer and rinse fluid is uniform across the surface of the substrate.

It is a further technical advantage of the present invention that the reaction time between the developer and the substrate is uniform across the surface area of the substrate.

It is a still further technical advantage of the present invention that the time and intensity of the chemical reaction between the developer and the photosensitive film on the substrate is uniform between successive substrates processed using the mechanism of the present invention.

It is a still further technical advantage of the present invention that holding several important process parameters constant permits a wider process window for parameters not within the control of the apparatus.

It is a still further technical advantage of the present invention that the linear developer may be disposed in a smaller footprint than prior art systems such as spin coating systems and batch coating systems.

It is a still further technical advantage of the present invention that less fluid is consumed for the amount of substrate developing as compared with prior art systems.

It is a still further technical advantage of the present invention that the system presents a lower overall cost of ownership than prior art systems.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
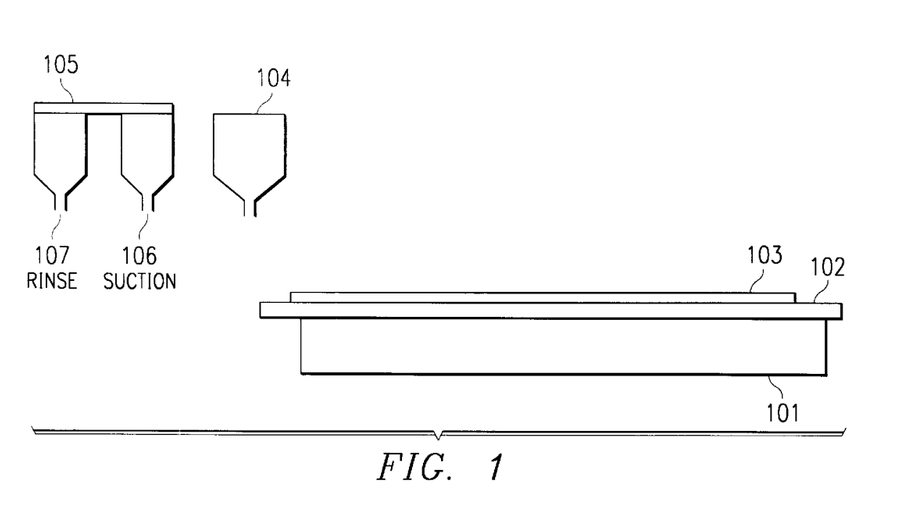
FIG. 1 depicts a side view of a substrate with photosensitive layer on it and two heads which will pass over it, according to a preferred embodiment of the present invention.

FIG. 1 depicts a side view of a substrate 102 with photosensitive layer 103 on it and two heads which will pass over it, according to a preferred embodiment of the present invention. FIG. 1 depicts a simplified view of the chuck 101. The chuck 101 is described in more detail later on.

In a preferred embodiment, chuck 101 supports substrate 102 which has an exposed photosensitive layer 103. The exposed photosensitive layer could consist of many materials including but not limited to positive or negative photoresist. The substrate could consist of one of many types of materials including but not limited to flat panel displays, such AMLCD (active matrix liquid crystal display), PDP (plasma display panel), FED (field emission display), a variation of circuit board, or IC wafer or high density interconnect board.

In a preferred embodiment, an independent developer dispensing or extrusion head 104 is brought to the edge of a substrate 102 having an exposed photosensitive layer 103, and is then moved over the substrate 102 at a predetermined and constant velocity while dispensing developer fluid at a constant rate, thereby completely and uniformly covering the substrate with developer fluid. Preferably, the developer head 104 makes only one pass over the substrate 102. However, depending upon either a recipe driven formula based on experience gathered about a particular developer, or particular type of photosensitive layer, or based upon feedback from sensors such as a vision system, additional developer deposition operations may be performed.

In a preferred embodiment, The inventive mechanism then waits for a predetermined dwell time during which the developer fluid chemically reacts with the photosensitive layer 103. The duration of this dwell time may be varied depending upon a number of factors, including but not limited to the developer fluid temperature, the ambient air temperature, the substrate 102 temperature, the chemical strength of the developer fluid, the velocity of developer head movement, and optionally, the estimated amount of developing needed. In an alternative embodiment, the inventive mechanism could immediately proceed with the next operation.

In a preferred embodiment of the present invention, the suction head 106, and rinse head 107 are mechanically fixed with respect to each other in a single suction/rinse structure 105. The two heads are combined because they are frequently used at the same time, typically in post developer deposition operations, and mechanically attaching them to a single structure ensures that their velocity with respect to the substrate is constant. The suction/rinse structure 105 is preferably configured so that the suction head 106 leads the rinse head 107 as the suction/rinse structure 105 moves across the substrate 102. In an alternative embodiment, the suction and rinse heads could be mounted independently of one another and/or mounted on a common structure with the developer head. Further, the suction/rinse head could be set up so that the rinse head leads the suction head. A variety of combinations and permutations of the mounting arrangements of the various operating heads (developer, suction, and rinse) can be implemented without departing from the present invention.

In a preferred embodiment, the mechanism then moves a second structure, the suction/rinse structure 105, comprising a suction head 106 and rinse head 107 over the substrate 102 at a constant velocity which is the same as the velocity at which the developer head 104 was moved over the same substrate 102, with the suction head 106 leading the rinse head 107. The suction head passes very close to the substrate 102 surface applying suction to this surface, preferably employing a constant suction level, or negative pressure level, during the entire trip along the substrate 102, thereby removing from the substrate 102, material comprising unreacted developer along with products of chemical interaction between the developer and the photosensitive layer 103. The suction head 106 continues the action of vacuum removal of loose fluid matter throughout the length of the substrate 102.

In an alternative embodiment, the suction head may be omitted and excess fluid and reaction material removed from the substrate surface as a consequence of natural gravitationally induced flow of the fluid and reacted matter into grooves surrounding the substrate and eventually into an overflow trough. The grooves and trough of a preferred embodiment could be appropriately enlarged to handle the additional material if the suction head is omitted in favor of the material removal scheme of this alternative embodiment.

In a preferred embodiment, the rinse head 107 follows a fixed distance behind the suction head 106 and dispenses rinse fluid onto the substrate 102, preferably at a constant rate throughout the head's travel along the substrate. Where the photosensitive layer is positive photoresist, the rinse fluid is preferably de-ionized water (DI). Contact of rinse fluid with the substrate 102 both carries away loose material, and neutralizes, or arrests chemical activity of the developer with the photosensitive layer 103. An important contributor to uniformity in developer action across the substrate is the consistency of the suction/rinse structure 105 velocity with the developer head 104 velocity, and the constancy of each of the two head velocities throughout their respective movements or excursions across the substrate 102.

The fluid dispense rates in the rinse and developer heads may be controlled by several mechanisms including but not limited to varying the opening of a slot or orifice at the bottom of the fluid dispenser, opening a plurality of slots, and varying the pressure or the flow route in the fluid supply line.

With the velocities of the respective heads subject to the stated constraints, and with all operations starting on the same end of the substrate 102, the entire substrate surface will be exposed to developer for the same period of time. This is because the area on the substrate first exposed to developer will be the area first exposed to rinse fluid, and the area last exposed to developer will be the last exposed to rinse fluid, with all intermediate areas on the substrate accordingly receiving rinse fluid in the same order in which they received developer. In addition to the travel time of the developer head and the suction/rinse head, the chemical reaction time includes the dwell time which is inherently the same for all areas on the substrate 102.

Therefore, the combination employing the same velocity for both operating heads, with this velocity being held constant throughout the travel of both heads, and a "first developed first rinsed" process sequence, results in a uniform develop time for the entire substrate 102.

Holding head travel velocities constant for operations pertaining to successive substrates 102 placed on the chuck 101 is possible but not necessary. If a succession of substrates have the same characteristics, it will likely be desirable to maintain the head velocities the same for the successive developing, suction, and rinsing operations thereby extending the uniformity previously mentioned for a single substrate to a succession of substrates. If, however, substrates to be treated differ in their dimensions or chemical nature, the inventive mechanism can change the single velocity at which all the substrate operation heads (developer, suction, rinse) move. It is still the case that the substrate operation heads would all move at the same velocity for any one substrate 102.

Although, in the preferred embodiment of the present invention, it is an advantage for the developer head 104, suction head 106, and rinse head 107 to travel across the substrate 102 starting at the same end, and going in the same direction at the same constant velocity, alternative embodiments may vary this arrangement and still be within the scope of the present invention. Depending upon the nature of the photosensitive layer, the developer, and other process parameters (including developer chemical strength, and developer temperature), and in general, the tolerance of the chemical reaction for variations in reaction time, it may be possible to have the various heads travel across the substrate starting at opposite ends, and travel at different velocities in spite of the resulting variation in developer reaction time.

In a preferred embodiment, the suction and rinse processes, are performed in a number of iterations to ensure that all developer material and reacted material is either removed by suction from the substrate or is directed into an overflow trough on the chuck 101. The last iteration of the remove/rinse or suction/rinse head is purely a suction removal operation. Determination of when the remove (suction) and rinse operation is ready for this last "remove-only" operation may be recipe driven based on experience as to how many iterations of the process are required, or alternatively, may be based on feedback from a vision or other sensory feedback system.

Figure 2:
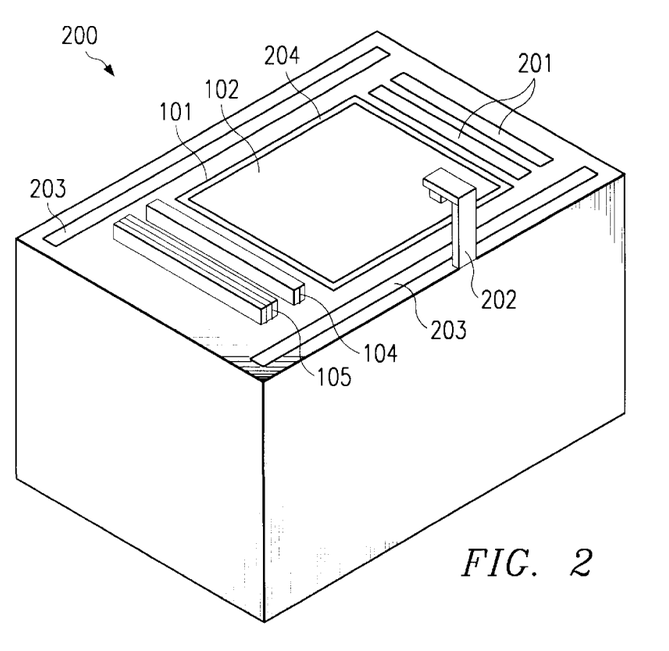
FIG. 2 depicts an isometric view of the chuck with attached equipment according to a preferred embodiment of the present invention.

FIG. 2 depicts an isometric view 200 of the chuck 101 with attached equipment according to a preferred embodiment of the present invention.

In a preferred embodiment of the present invention, the chuck 101 supports a substrate 102 preferably surrounded by an overflow drain trough 204. Fluid dispensed from the developer head 104 and the rinse head 107 (FIG. 1) which is not removed by the suction head 106 (FIG. 1) during its pass over the substrate 102 is directed into the trough 204 preferably by a groove which runs from an edge of the substrate 102 toward the trough 204. Alternatively, the groove could traverse the surface of the chuck 101 underneath the substrate 102, or begin at some location not immediately adjacent to the substrate.

The developer head 104 and suction/rinse structure 105 are shown lying in their respective storage locations 201 on the chuck 101 surface. Preferably, the chuck comprises head storage locations at both ends of the chuck, although, alternatively, a single set of stations could be used.

In a preferred embodiment, the developer head 104 and suction/rinse structure 105 are carried above the substrate 102 with a gantry structure which moves along the linear travel rails 203. A single gantry structure could be used which would pick up each head as it is needed and drop it off in the most convenient storage location when operation using that head is completed. The gantry or other head moving system would preferably employ a secure fastening mechanism for connecting to and disconnecting from the detachable equipment, where "detachable equipment" is generic to the developer head 104, and the suction/rinse or rinse/suction structure 105. This fastening mechanism could consist of any one of a group of attachment mechanisms including but not limited to grippers, clamps, latches, clips, detents, suction attachments, locking pin with detent balls wherein ball bearings are forced into a detent during engagement and allowed out during disengagement, and a perpendicular force latch. The selected attachment means preferably includes a quick-release mechanism for efficient attachment and detachment of the equipment from the gantry.

The gantry system or other moving means, with detachable equipment properly attached to it, and in communication with control means to set gantry velocity and fluid flow rate and/or suction level in the suction head 106 (FIG. 1), is able to move across the substrate 102 at a prescribed velocity. When at either end of the chuck 101, the gantry system can drop off the detachable equipment if necessary. Depending upon the required sequence of operations for a particular process, and the available equipment, the gantry may pick up a different head either near its present location, or may move to the other end of the chuck, and pick up another head at a station 201 at that end of the chuck 101.

In an alternative preferred embodiment, a plurality of gantry systems may operate on the same chuck 101 at the same time. If necessary, more than one gantry system may carry a head performing an operation on the substrate at one time. Each gantry system may be dedicated to particular detachable equipment (developer head or suction/rinse structure), or each gantry system may be attachable to any of the operating heads to be used on the chuck 101. For a gantry system to be used with more than one operating head, the attachment means would preferably be the same for the various operating heads on the chuck 101.

In a preferred embodiment, the gantry system employs rolling contact with the rails 203. Alternative possible motion interfaces between the gantry system and a support surface, include but are not limited to frictional sliding contact, electromagnetic levitation, and air bearings.

In a preferred embodiment the gantry system could employ a height control system to maintain the height difference, or head gap, between any operating head and the substrate 102 surface. Such a height control system would employ a sensor for continuously reporting the height of the gantry or operating head above the substrate, and a motor or actuator to respond in real time to the height sensor information by restoring the operating head to predetermined "set point" height. Such a height control system is described in detail in commonly assigned, co-pending, and concurrently filed U.S. patent application Ser. No.: [54183-P016-987567], entitled "SYSTEM AND METHOD FOR ADJUSTING A WORKING DISTANCE TO CORRESPOND WITH THE WORK SURFACE".

In an alternative preferred embodiment, moving means other than a gantry structure may be used to move the heads with respect to the substrate 102. Alternative moving means include but are not limited to use of a robotic arm, and means for moving the substrate 102 under stationary operating heads.

The develop monitor camera, or monitor camera 202 is shown rigidly attached to the top of the chuck 101. Alternatively, the camera 202 may be attached to the system from in a reference position to chuck 101. In a preferred embodiment, the camera 202 continuously views a selected point on the substrate 102 and is in communication with a control system which receives information from the camera for the purpose of making process decisions depending upon the condition of the substrate 102.

In a preferred embodiment, information from the camera 202 can be compared to a known surface pattern to determine if the develop process is complete. Based on the information received from the camera 202, the system may decide to continue to apply developer to the substrate 102, or discontinue the develop process by making a run over the substrate using the suction/rinse structure 105, and thereby stop the develop process.

An aspect of the present invention permitting visual information viewed at a single point on the substrate 102 to be taken as representative of the whole substrate is the degree of uniformity of develop and rinse operation across the substrate resulting from monitoring of velocity and fluid (developer and rinse) dispensing rates. The uniformity makes any point on the substrate a reliable indicator of the condition of the substrate 102 as a whole. This would not be the case with prior art systems which experienced significant variation in developer distribution as a function of position on the surface of a substrate.

Similarly, using this embodiment, information from the camera 202 can be used to determine whether the rinse process is complete by comparing sensory information provided by the camera 202 to a known image, template, or visual/video test pattern, representing a desired condition at the conclusion of the rinse process. Based on the information received from the camera 202, the system may decide to either continue the rinse process, or terminate operation of the suction/rinse structure 105 by making a suction-only run across the substrate 102.

In a preferred embodiment, in addition to employing camera 202 feedback information to determine the condition of the substrate 102 within a single develop process, as just discussed, the feedback information can be used to accumulate information gathered over a number of processing runs, including developing, suction, and rinse, to correlate operating head activity with observed results on a number of substrates. Control means may then use such accumulated knowledge about operating head "input" to the chemical reaction of the develop process and the observed "output" of the chemical reaction in the form of observed substrate condition to appropriately modify operating parameters of the develop process, and/or to inform a supplier about variation in the chemical strength of the supplied developer or other chemical. The parameters which may be affected include, but are not limited to travel velocity of the operating heads across the substrate, fluid dispensing rates in the rinse and develop heads, suction levels used in the suction head, the total amount of fluid per unit area dispensed in a given run of a rinse or develop head over a substrate, the desired temperatures of the rinse and develop fluids and the chuck and substrate, and adjustment of any forms of reaction catalysis employed such as ultrasonic energy, air jets, or fluid injection.

In an alternative preferred embodiment, the camera 202 need not be fixed, but may be mounted on the gantry system or other moving means thereby enabling the camera to view and report surface information about points along a certain length of the substrate 102 instead of only a single point. The control system would then be able to gauge the degree of uniformity in surface treatment being achieved by the develop, suction and rinse processes.

In an alternative preferred embodiment, a plurality of cameras 202 could be deployed at various locations on the chuck 101 each viewing a different portion of the substrate 102. With this embodiment, a control system would be able to compare the condition of the surface prior to an operation, be it developer dispensing, suction, or rinse fluid developing, with the condition of the surface succeeding the performance the operation, as the cameras could be located such that they are on different sides of an ongoing operation. The system would of course also be able to compare the substrate 102 surface condition at different points on the substrate surface when no operation is under way to determine the degree of uniformity being achieved by the operation concerned.

In a preferred embodiment, the chuck 101 would comprise means for raising and lowering the substrate in response to sensory information to maintain a consistent height difference, or head gap, between an operating head and the substrate 102 surface. This chuck-based substrate height control could be additional to, or alternative to, any height control mechanism built into the gantry system. The substrate height control mechanism would require deployment of a sensor to measure the head gap between an operating head and the substrate surface 102 and means for correcting the head gap according to a predetermined head gap set point. Such a system to measuring and correcting working distance or head gap is described in detail in commonly assigned, co-pending, and concurrently filed U.S. patent application Ser. No. [54183-P016-987567], entitled "SYSTEM AND METHOD FOR ADJUSTING A WORKING DISTANCE TO CORRESPOND WITH THE WORK SURFACE".

In a preferred embodiment, the chuck 101 would comprise means for catalyzing the chemical reaction taking place on the substrate surface 102. Preferably, ultrasonic energy would be generated within the chuck by a transducer and transmitted to the substrate surface through direct mechanical contact between the transducer and the chuck surface 101 and in turn between the chuck 101 surface and the substrate 102. Alternative means for catalyzing the chemical reaction include, blowing air over the reaction surface while contaminating the developer fluid with gas bubbles, and generating turbulence by injecting inert fluid into the reaction fluid mixture at selected points along the substrate 102 surface.

In a preferred embodiment, the chuck comprises means for accurately controlling the temperature of the substrate 102 and thereby contribute to controlling the temperature of the reactants in the developing process.

A preferred embodiment for accomplishing chuck temperature control comprises a fluid reservoir, temperature control fluid in said reservoir, a pump, tubing or other fluid delivery means connecting the various fluid components together, a heater and/or chiller with integrated thermostat attached to said fluid reservoir to accurately preserve the fluid temperature in the reservoir, and heat transfer tubing disposed as close as possible to the substrate 102. The pump would operate continuously to ensure that freshly temperature-controlled fluid is delivered to the tubing or other fluid carrying vessels near the substrate and to return to the reservoir fluid which may have deviated from the set point temperature.

A preferred embodiment of the heat transfer tubing would simply involve running tubing carrying the temperature control fluid along the upper surface of the chuck just under the substrate 102 so as to keep the substrate 102 temperature as close as possible to that of the temperature control fluid. This arrangement could be enhanced by extending fins made of metal or other thermally conductive material from the tubing to contact various portions of the substrate thereby improving the thermal conductance between the substrate and the temperature control fluid. Alternatively, passages could be drilled within the chuck to allow the fluid to circulate and control chuck temperature.

Temperature control of substrates was difficult in prior art systems and the present invention therefore presents a technical advantage. With spin coating systems, the substrate is spinning while different fluids spread out along the substrate surface making it very difficult to implement the type of fluid distribution based temperature control system described above. With batch coating systems, the entire substrate is immersed in a fluid bath and then removed, placing the substrate very much at the mercy of the temperature of the bath into which it is being immersed. The chuck temperature control system of the present invention therefore represents an improvement in the art.

Figure 3:
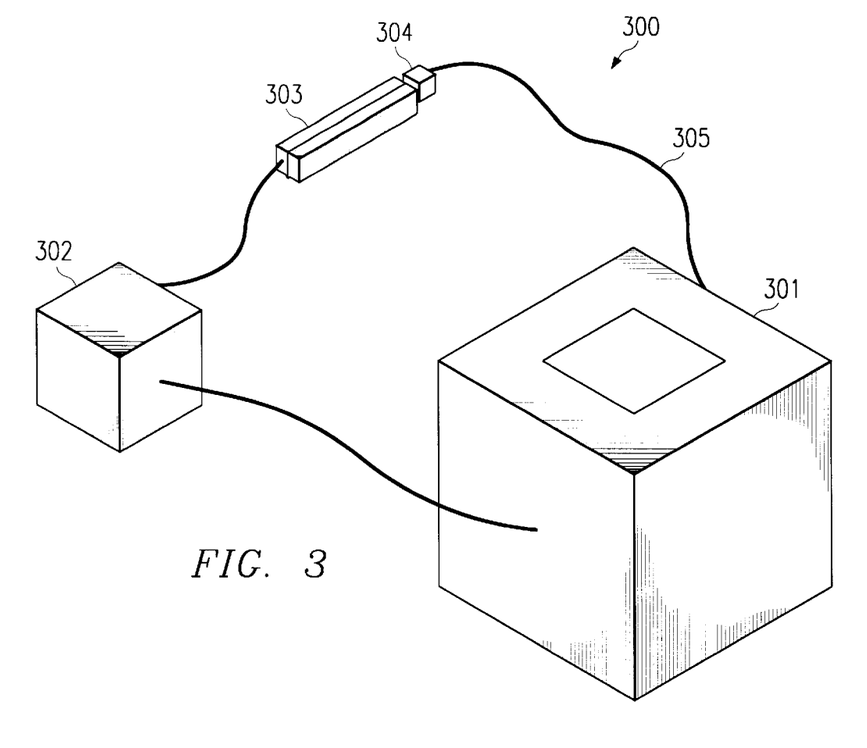
FIG. 3 depicts an isometric view of the fluid flow path for developer and rinse fluid according to a preferred embodiment of the present invention.

FIG. 3 depicts an isometric view of the fluid flow path for developer and rinse fluid according to a preferred embodiment of the present invention.

In a preferred embodiment of the present invention, both developer fluid and rinse fluid are contained in isolated flow environments before being dispensed onto a substrate surface. This isolation prevents contaminants from reducing the effectiveness or purity of the fluids and enables control to be exercised over the temperature and other aspects of the fluid. In addition to being isolated from outside sources of contamination, the fluids (developer and rinse fluid) are continuously recirculated through an entire fluid path to enable accurate temperature control and to prevent bacterial growth and other problems associated with stagnant fluid. The discussion of FIG. 3 is intended to be generic with respect to rinse fluid and developer fluid which may both be recirculated employing the apparatus of FIG. 3.

In FIG. 3, Temperature control unit 301 preferably comprises a fluid reservoir as well as well as a heater and/or chiller with a selectable thermostat for accurately controlling the temperature of a substantial quantity of fluid. Pump 302 operates continuously to pump fluid through the entire recirculation path 300 regardless of whether any fluid is being dispensed onto a substrate. Proceeding along the fluid flow path, the next item is the dispensing head 303. The developer head may have a controllable opening at the bottom for dispensing fluid onto a substrate when instructed to do so. Attached to the dispensing head 303 is two way valve 304.

When the dispensing head 303 is not dispensing fluid onto the substrate, two way valve 304 is set to allow fluid to flow along the recirculation path forming a closed loop of fluid flow back to the Temperature control unit 301. When it is desired to dispense fluid onto the substrate, two way valve 304 is switched to direct fluid through the orifice at the bottom of the dispensing head 303 onto the substrate surface. Potentially, the orifice in the dispensing head has a controllable opening size to permit the fluid flow onto the substrate to be precisely controlled. When dispensing onto the substrate is finished, the dispensing orifice is closed, and two way valve 304 is switched to direct fluid flow back along the recirculation path. In an alternative embodiment, the recirculation flow could be continued even while the dispensing head 303 is in the process of dispensing fluid onto the substrate.

In a preferred embodiment of the present invention, the flow path of the fluid through the dispensing head 303 and other elements in the recirculation path 300 are of constant cross sectional geometry. It is beneficial to avoid bottlenecks in fluid flow which can cause pressure changes and fluid flow velocity changes possibly causing changes in recirculating fluid temperature. The internal diameter of the flow path of the process fluids (rinse and developer) is typically 0.5 inches or 3/8 inches.

In a preferred embodiment of the present invention, the surfaces with which the recirculating fluid makes contact in the setup of FIG. 3 are entirely non-metallic. The chemical strength and purity of the fluid (either developer or rinse) is best preserved if the fluid has no opportunity to interact with metallic surfaces before being deposited on a substrate. Acceptable materials include, but are not limited to Teflon, polypropylene, and various types of plastic (fluorinated and non-fluorinated).

In a preferred embodiment, the lines shown connecting the components in the recirculation path 300 comprise temperature controlled fluid flow paths 305. In a preferred embodiment, temperature of the fluid is achieved by running the recirculating fluid through a central tube of appropriate material and cross-sectional geometry, and encircling this developer tube with a second tube containing temperature control fluid which is isolated from any direct contact with the recirculating fluid. Precisely temperature controlled water or other fluid is then circulated through the outer tube. Transfer of thermal energy between the inner and outer fluid passages helps ensure that the fluid of interest in the inner tube will remain as close as possible to the temperature of the outer, temperature control fluid. The temperature control fluid is not subject to the same restrictions as the developer fluid with respect to the materials with which it may make contact, the flow velocities permitted and the cross sectional geometries through which it may pass, and therefore more aggressive action may be taken to bring the outer flow or temperature control fluid into conformity with the required temperature. These temperature controlled flow paths 305 help in maintaining the temperature of the recirculating fluid throughout the travel of said fluid along the recirculation path 300.

In a preferred embodiment, the temperature of the developer fluid and the rinse fluid throughout the system should not vary by more than a fraction of a Celsius degree from the temperature set point. The set point is preferably between 21 and 24 degrees Celsius.

Various alternative embodiments exist for effecting heat transfer between the developer fluid and the temperature control fluid including, but not limited to deploying fins or other protrusions of non-metallic material into the developer flow path which are in communication with the temperature control fluid to aid in heat exchange, having the temperature control fluid flow in the inner tube and the developer fluid in the outer tube, and deploying heat exchange fins in the temperature control fluid path.

In an alternative preferred embodiment, a single temperature control fluid recirculation system would jointly control the temperature of the rinse and developer fluid flow paths 305, and the chuck 101 and substrate 102 (FIG. 2) and the develop and rinse extrusion heads, using a common set point temperature. This approach would be preferred when the chemical reaction on the substrate is optimized by having the dispensed fluids (rinse and developer) at the same temperature as the substrate surface. This embodiment is preferably implemented by deploying a single temperature control unit having a fluid reservoir and connected to a single network of tubes carrying temperature control fluid in contact with the rinse and developer fluid tubing (not in contact with the rinse and developer fluids themselves), as well as with various portions of the chuck, thereby bringing the chuck, substrate, develop and rinse head, and process fluids (rinse and developer) to the same temperature.

Figure 3A:
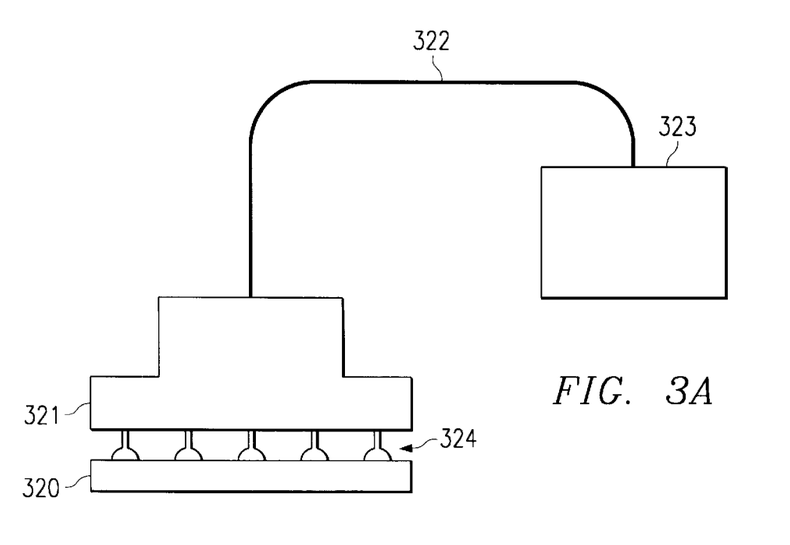
FIG. 3A depicts a view of a fluid recovery system according to a preferred embodiment of the present invention.

FIG. 3A depicts a view of a fluid recovery system according to a preferred embodiment of the present invention. The suction head 321 comprising suction cups 324 or other mechanism for applying suction to fluid on the surface of the substrate 320 moves along the substrate 320 at a carefully controlled height, vacuuming up fluid on the substrate surface. The material vacuumed off the substrate surface 320 most likely comprises unreacted developer fluid, product of the chemical reaction between the developer and whatever photosensitive layer was present, and possibly rinsing fluid. The removed material is sent along tube 322 and stored in recovery reservoir 323.

The fluid gathered in reservoir 323 can be subsequently treated, filtered, processed so as to recover some useful amount of developer fluid. In addition to performing the necessary task of removing unwanted matter from the substrate surface, the fluid recovery system permits developer fluid to be recycled thereby reducing the waste product of the reaction and enabling reusable developer fluid to be eventually extracted from the mixture in the recovery fluid reservoir 323. In a preferred embodiment, the developer removed from the substrate and placed in the reservoir can be tested to determine whether the chemical reaction on the substrate is operating properly, and to determine the stage of said chemical reaction.

Figure 4:
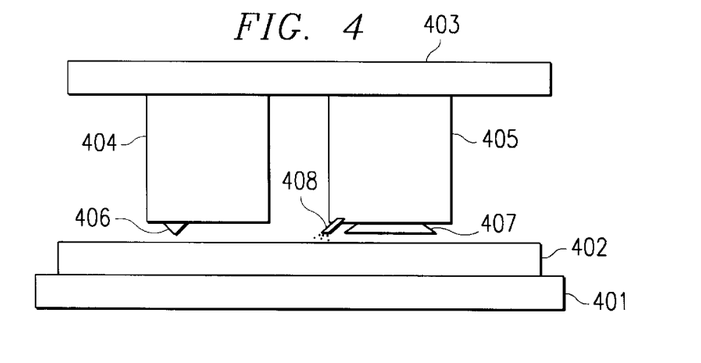
FIG. 4 depicts a side view of a linear developer according to an alternative embodiment of the present invention.

FIG. 4 depicts a side view of a linear developer according to an alternative embodiment of the present invention. FIG. 4 depicts a linear developer mechanism that is based on iterative processes. It is noted that in the setup of FIG. 4, the carriage 403 preferably moves to the left while performing operations on the substrate 402.

In FIG. 4, a chuck 401 supports a substrate 402 which is brought under a dispensing mechanism 404 having an extruding slot 406. In this embodiment, the dispensing mechanism 404 is attached to a carriage 403 which allows the dispensing mechanism 404 to proceed back and forth over the substrate 402, as necessary, to complete the process of dispensing developer fluid. Behind the dispensing mechanism 404, is the vacuuming mechanism 405. The vacuuming mechanism 405 is also attached to the carriage. The vacuuming mechanism 405 can be positioned a specified distance behind the dispensing mechanism 404. On the vacuuming mechanism 405, is a dislodging tube 408 for breaking up any reactants on the substrate surface to allow more efficient vacuuming.

In its preferred embodiment, the dislodging tube 408 sprays a stream of air. The vacuuming mechanism 405 includes some type of suction means and nozzle 407 located above the substrate 402 to remove undesired material from the surface. Alternatively, the dislodging tube or mechanism 408 could emit a chemically neutral fluid which would also aid in preparing reactants on the substrate surface for removal and would avoid altering the chemical makeup of any solution on the substrate surface.

The linear developer may be used in a variety of ways. For example, when extrusion coating a photoresist, the dispensing mechanism will place a layer of the photoresist on the substrate. In order to achieve a fluid coating of a certain thickness, the carriage moves the dispensing mechanism 404 across the substrate 402 as many times as necessary to achieve the desired thickness. The vacuum or suction mechanism 405 will not be used during this process.

The dispensing mechanism 404 may also be used for applying developer to a substrate having exposed photoresist. Initially, the dispensing mechanism layers the developer onto the substrate. The developer reacts with the exposed photoresist and generates a soften material (for positive resist). As the vacuuming mechanism approaches the reacted area, the dislodging tube generates a current of air, or in other embodiments, a fluid stream, to dislodge the reacted material and also improve the reaction process by generating movement that will cause unreacted materials to meet and react. Subsequently, the vacuuming mechanism will pull in the reacted products and any unreacted developer, leaving behind the exposed photoresist and any unreacted, unexposed photoresist. The process will be repeated until only the exposed photoresist is on the substrate.

A use for the dispensing mechanism during an etch process is to dispense a chemical that will react with, and etch the surface of the substrate that is not covered by the photoresist. Depending on the chemical used, the dislodging tube may or may not be initiated. However, the vacuuming mechanism is actuated to clean the substrate surface of the chemical and reacted material.

For the stripping process on a substrate, the dispensing mechanism will coat a chemical compound on the substrate that will react with the exposed photoresist. The dislodging tube will loosen the reacted material, and the vacuuming mechanism will pull up all reacted material and any unreacted stripping chemical from the substrate.

Figure 5:
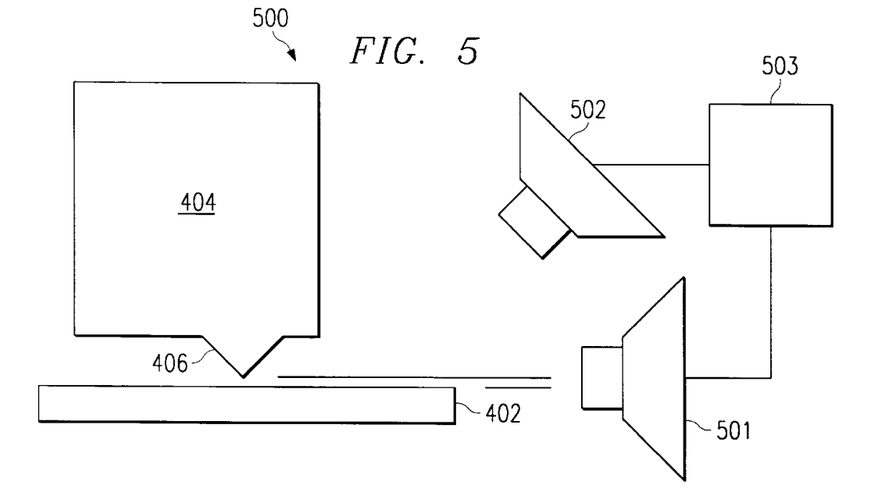
FIG. 5 depicts a block diagram of a control system in communication with a dispensing mechanism and sensing devices according to an alternative embodiment of the present invention.

FIG. 5 depicts a block diagram 500 of a control system in communication with a dispensing mechanism and sensing devices according to an alternative embodiment of the present invention. In the preferred embodiment, the linear developer is guided by a control system. Referring to FIG. 5, the linear developer can have CCD cameras, 501 and 502, or other form of sensory device, send position data regarding the dispensing process back to a control unit 503. Depending on the efficacy of the process, the control system can move the dispenser 404 with slot 406 back over the substrate 402 and repeat the dispensing process. The same may also be repeated as necessary with the vacuuming process.

Figure 6:
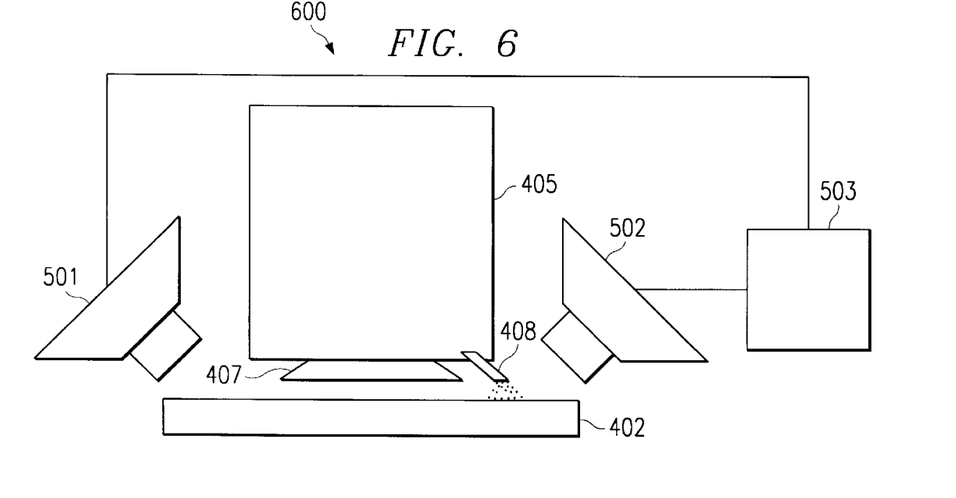
FIG. 6 depicts a block diagram of a control system in communication with a suction mechanism and sensing devices according to an alternative embodiment of the present invention.

FIG. 6 depicts a block diagram 600 of a control system in communication with a suction mechanism and sensing devices according to an alternative embodiment of the present invention. Referring FIG. 6, the first CCD camera 502 will send data back regarding the pre-vacuum status of the substrate 402, and the second CCD camera 501 will send back data representing the post vacuum status of the substrate thereby providing for a check of the resulting vacuum process. The control unit 503 will then analyze the results of the vacuuming process using vacuum head 405 with nozzle 407 and dislodging tube 408, to see if residue remains on the substrate 402. If the substrate still has residue, the control system will repeat the vacuum process or change vacuuming variables, such as applying greater suction or using a greater pressure through the sprayer.

Figure 7:
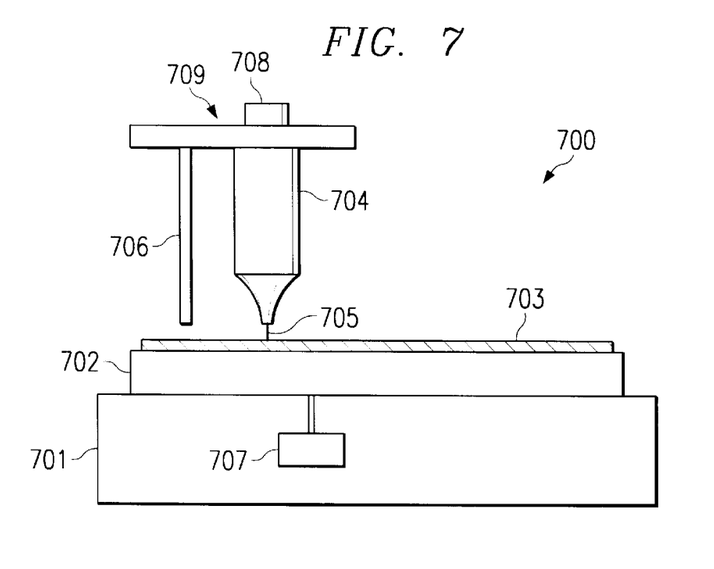
FIG. 7 depicts a view of a linear developer comprising catalyzing mechanisms according to a preferred embodiment of the present invention.

FIG. 7 depicts a view 700 of a linear developer comprising catalyzing mechanisms according to a preferred embodiment of the present invention. In a preferred embodiment of the present invention, the linear developer may comprise various possible means for catalyzing or enhancing the process of chemical reaction on the substrate 702 surface. FIG. 7 shows a chuck 701 with incorporated ultrasonic transducer 707. The chuck 701 supports substrate 702 on top of which is the area or zone of chemical reaction (or "reaction zone") 703. This zone of reaction 703 is where the developer fluid and photosensitive layer, which may be negative or positive photoresist, chemically react. The reaction zone typically comprises a thin layer of fluid interacting with the photosensitive layer. It is desirable to make the chemical reaction in this zone 703 as thorough, uniform, and rapid as possible. The catalyzing or enhancing mechanisms discussed below are directed toward this goal.

Ultrasonic energy can act to enhance the chemical reaction occurring in the reaction zone 703. This energy may originate in the chuck using ultrasonic transducer 707 and be directed toward the surface of the chuck 701 using any form of solid connection between the transducer and the chuck surface, and further transmitted through the substrate 702 to the reaction zone 703. The chuck's ultrasonic transducer may be located anywhere within the chuck 701 as long as there is a continuous solid connection between the transducer 707 and the substrate 701 to carry the ultrasonic vibrations to the substrate 702 and in turn to the reaction zone 703. Note that more than one ultrasonic transduces 707 may be used to provide an even distribution of ultrasonic energy over the entire reaction zone 703.

Additionally, or alternatively, ultrasonic energy can be generated on a fluid dispensing head 704 through the use of an ultrasonic transducer 708 located on the dispensing head structure 709. The energy generated by transducer 708 is transmitted through dispensing head 704, through fluid stream 705, and in turn into the reaction zone 703, thereby energizing the chemical reaction. The transducer 708 may be located anywhere on the dispensing head structure 709 as long as it maintains a solid link with the slot in the fluid dispenser 704 thereby transmitting ultrasonic energy thereto. The ultrasonic energy transmitted to the slot of the dispenser 704 will be transmitted through the fluid 705 into the reaction zone 703. Note that more than one ultrasonic transduces 707 may be used to provide an even distribution of ultrasonic energy over the entire reaction zone 703.

Additionally, or alternatively, a tube 706 may be disposed on the dispensing head structure 709 which is used to emit air at a selected velocity toward the reaction zone 703 thereby inducing some fluid turbulence and energizing or enhancing the chemical reaction in the reaction zone 703. When emitting air or other gas toward the reaction zone 703, the velocity of air flow must be selected so as to ensure that the fluid in the reaction zone is not unduly disturbed, or in any way contaminated with impurities contained in said air flow. The air or gas may be appropriately filtered to ensure that impurities are not present. The air or gas emission preferably succeeds dispensing of fluid 705 by the fluid dispenser 704 over a given point on the substrate 702, so that turbulence may be induced in recently deposited fluid.

Alternatively, or additionally a tube mounted on the dispensing head structure 709 could emit an inert fluid toward the reaction zone 703 to induce some fluid turbulence and thereby energize the chemical reaction in the reaction zone 703. The inert fluid, as with the air or gas, should be appropriately filtered to ensure that no impurities are introduced into the reaction zone 703. The introduction of inert fluid preferably succeeds dispensing of fluid 705 by the fluid dispenser 704 over a given point on the substrate 702, so that turbulence may be induced in recently deposited fluid. Additional possible mechanisms for reaction enhancement include but are not limited to directing a controlled light or other electromagnetic energy source at the reaction zone 703.

In an alternative preferred embodiment, tubes or other devices for directing air or fluid at the reaction zone 703 may be mounted on the chuck and be either fixed or movable with respect to the chuck 701.

In an alternative preferred embodiment, enhancement of the chemical reaction in the reaction zone can be accomplished by appropriately adjusting the velocity of fluid dispensing from the rinse head as it passes over the substrate 702.

Figure 8:
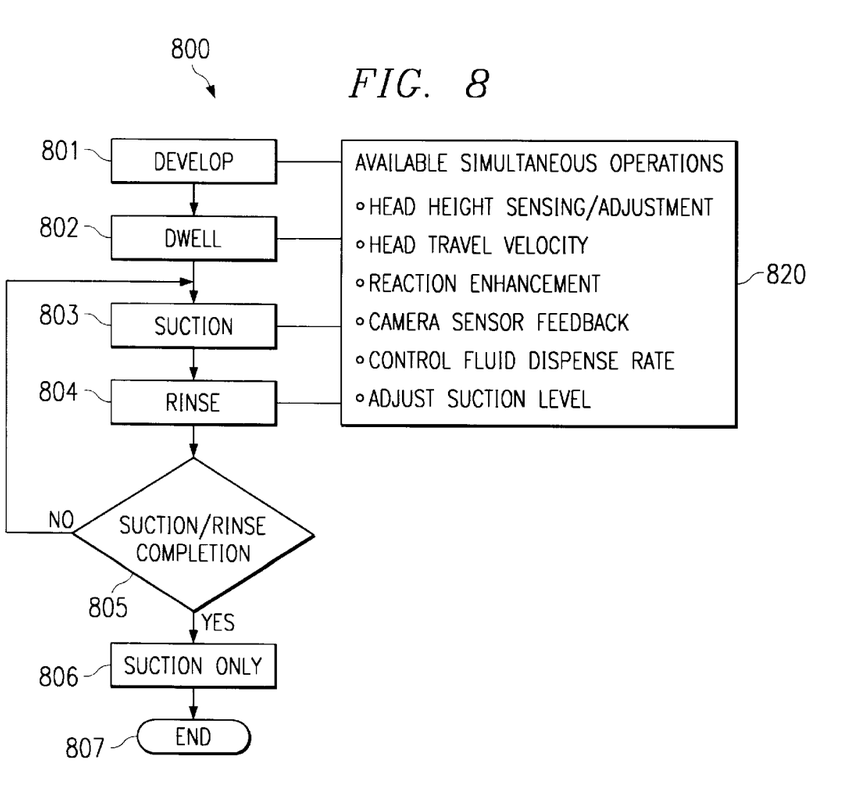
FIG. 8 depicts a flowchart indicating a sequence of events of the linear developer according to a preferred embodiment of the present invention.

FIG. 8 depicts a flowchart 800 indicating a sequence of events of the linear developer according to a preferred embodiment of the present invention. In the legend for "A.S.O.", or available simultaneous operations, six operations which can be performed simultaneously with the basic process steps of linear developing are listed. These steps may optionally be performed at various stages of the developing process as indicated by the connections of process steps to "A.S.O." step boxes within the flowchart. The actual hardware for effecting the steps described has been described earlier in this specification.

Beginning with the available simultaneous operations, there is head height sensing and adjustment. This is referred to earlier in this specification and is described in detail in commonly assigned, co-pending, and concurrently filed U.S. patent application Ser. No.: [09/227,459], entitled "SYSTEM AND METHOD FOR ADJUSTING A WORKING DISTANCE TO CORRESPOND WITH THE WORK SURFACE". This mechanism is available in a preferred embodiment of the present invention. Second is the head travel velocity. This may be appropriately adjusted by control means in communication with the gantry system or other moving means carrying the various operating heads. Third is reaction enhancement or catalysis which is discussed in connection with FIG. 7 and may include, but is not limited to directing air and/or fluid toward the chemical reaction and directing ultrasonic energy toward the reaction. The fourth item is camera sensor feedback whose use has been described at length and will not be repeated here. The fifth item is control of fluid dispense rate which may apply to dispensing of both developer and rinse fluid. The sixth item listed is the adjustment of suction level which applies to operation of the suction head. The above list is illustrative and not exclusive. Additions or deletions of items from the stated list of operations which can be conducted simultaneous with the basic process steps are possible without departing from the scope of the present invention.

At step 801, the process begins with the step of dispensing developer, or developer fluid, onto the substrate. The step of dispensing developer fluid 801 preferably includes moving a developer head with respect to a substrate at a controlled velocity while dispensing developer fluid onto the substrate at a controlled rate, until the substrate has been completely covered with developer fluid. A selection of the available simultaneous operations may also be performed during the step of applying developer fluid 801. It is noted that the process of developing does not end when the deposition of developer fluid ends, but continues until all unreacted developer fluid is either removed by the suction head, or neutralized by the rinse fluid. In this specification, the term "developer" and "developer fluid" are used interchangeably and mean the same thing.

At the conclusion of the step of developing 801, the mechanism may check the camera feedback to determine whether the substrate surface condition indicates that further developer deposition is necessary. If more developer fluid is required, step 801 can be repeated, and the substrate surface checked again. If the camera reports that no more developer fluid is needed, the mechanism moves on to the next step.

At step 802, the mechanism waits for a dwell time before beginning the suction/rinse operation. The dwell time may be a preselected period of time determined based on previous experience with the materials concerned, or may be determined in real time using feedback from the camera. When the dwell period is over, the mechanism moves on to the next step.

At step 803, the mechanism begins the suction operation which comprises removing developer fluid from the substrate using vacuum, or negative pressure. In a preferred embodiment, the suction and rinse heads are rigidly attached, and thereby inherently pass over the substrate, and perform their respective operations at the same time. Alternatively, however, the heads could be separated and operate independently. Whether the suction and rinse heads are attached to one another or not, these heads preferably move across the substrate at the same velocity as the developer head moved across this same substrate, thereby ensuring that all portions of the substrate are exposed to developer fluid for the same period of time.

During the suction 803 and rinse 804 steps, the mechanism may simultaneously perform a selection of the steps among the available simultaneous operations. In a preferred embodiment, the mechanism will perform the steps of controlling of the travel velocity of the heads, and the rate of fluid dispensing from the rinse head.

At step 805, the mechanism uses sensory information, preferably camera feedback, to determine whether further combined operation of the suction and rinse heads is necessary. If further suction and rinse is necessary, operation resumes at step 803. If further suction and rinse is not necessary, operation resumes at step 806, and the mechanism performs one last suction operation to remove any remaining fluid on the substrate. Multiple suction only steps 806 may be used to fully remove all fluid. The operation ends at step 807.

In an alternative embodiment, the determination as to whether to repeat the suction and rinse operation in step 805 may be made based on a predetermined recipe rather than on sensory feedback.

Although the present invention and its advantages have been described in detail, it should be understood that various changes, substitutions and alterations can be made herein without departing from the spirit and scope of the invention as defined by the appended claims.

What is claimed is:

1. A method for uniformly developing a photosensitive layer on a substrate, the method comprising the steps of:

moving a developer head in a substantially linear relative motion with respect to the photosensitive layer on the substrate, wherein the step of moving the developer head is initiated at a first end of the substrate and is performed at a velocity;

dispensing a developer material at a first controlled rate from the developer head during the step of moving the developer head; wherein contact of the developer material with the photosensitive layer commences a chemical reaction of developing;

moving a rinse head in the substantially linear relative motion with respect to the photosensitive layer on the substrate, wherein the step of moving the rinse head is initiated at the first end of the substrate and is performed at the velocity; and dispensing a rinse material at a second controlled rate from the rinse head during the step of moving the rinse head; wherein contact of the rinse material with the developer material on the photosensitive layer retards the chemical reaction of developing.

2. The method of claim 1, further comprising the step of:
   waiting for a predetermined dwell period after the step of dispensing the developer material before commencing the step of moving the rinse head.

3. The method of claim 1, further comprising the steps of:
   moving a suction head in the substantially linear relative motion with respect to the photosensitive layer on the substrate, wherein the step of moving the suction head is initiated at the first end of the substrate and is performed at the velocity; and
   removing loose material on a surface of the substrate via operation of the suction head, after the step of moving the developer head and before operation of the step of moving the rinse head, wherein said loose material comprises developer material and chemical reaction products.

4. The method of claim 3, further comprising the step of:
   repeating the step of moving the suction head and the step of removing loose material until the loose material has been substantially removed.

5. The method of claim 3, wherein the suction head is at a fixed distance with respect to the rinse head.

6. The method of claim 1, further comprising the step of:
   repeating the step of moving the developer head and the step of dispensing the developer material until developer material completely covers the photosensitive layer.

7. The method of claim 1, further comprising the step of:
   repeating the step of moving the rinse head and the step of dispensing the rinse material until the chemical reaction of developing has been halted.

8. The method of claim 1, further comprising the step of:
   supporting the substrate on a chuck.

9. The method of claim 8, further comprising the step of:
   providing a trough that encompasses the chuck for draining the rinsing material and developer material.

10. The method of claim 8, further comprising the step of:
    providing a camera that is connected to the chuck for monitoring the substrate.

11. The method of claim 10, further comprising the step of:
    comparing, via the camera, a surface pattern of the substrate with a known surface pattern to determine whether the chemical reaction is substantially complete.

12. The method of claim 11, wherein the step of comparing examines a single point of the substrate.

13. The method of claim 8, further comprising the step of:
    providing a catalyst for manipulating the chemical reaction.

14. The method of claim 13, wherein:
    the catalyst is ultrasonic energy;
    the step of providing the catalyst includes providing an ultrasonic transducer that is coupled to the chuck; and
    the ultrasonic energy is transmitted to the substrate by the ultrasonic transducer.

15. The method of claim 1, further comprising the step of:
    providing a gantry structure for supporting the developer head and the rinse head during the steps of moving the developer head and moving the rinse head.

16. The method of claim 1, further comprising the step of:
    providing a control system that controls the velocity, the first controlled rate, and the second controlled rate.

17. The method of claim 1, further comprising the step of:
    changing a location of the substrate in a direction that is orthogonal to a direction of the substantially linear relative motion based on sensory information to maintain a substantially consistent distance between the substrate and the developer head.

18. The method of claim 1, further comprising the step of:
    controlling the temperature of the chemical reaction.

19. The method of claim 18, wherein the step of controlling the temperature comprises the step of:
    controlling the temperature of the substrate.

20. The method of claim 18, wherein the step of controlling the temperature comprises the steps of:
    controlling the temperature of the developer material.

21. The method of claim 1, further comprising the steps of:
    providing a first reservoir for the developer material; and
    providing a second reservoir for the rinsing material.

22. The method of claim 21, further comprising the steps of:

recirculating the developer material in the first reservoir.

23. The method of claim 21, further comprising the steps of:

controlling the temperature of the developer material in the first reservoir.

24. The method of claim 1, further comprising the steps of:

recovering unused and dispensed developer material from the step of dispensing the developer material; and recycling the developer material for use in a subsequently performed step of dispensing the developer material.

25. A dispenser that uniformly develops a photosensitive layer on a substrate, the dispenser comprising:

a developer head that moves in a substantially linear relative motion with respect to the photosensitive layer on the substrate and dispenses a developer material at a first controlled rate, wherein movement of the developer head is initiated at a first end of the substrate and is performed at a velocity and contact of the developer material with the photosensitive layer commences a chemical reaction of developing; and a rinse head that moves in the substantially linear relative motion with respect to the photosensitive layer on the substrate and dispenses a rinse material at a second controlled rate, wherein movement of the rinse head is initiated at the first end of the substrate and is performed at the velocity and contact of the rinse material with the developer material on the photosensitive layer retards the chemical reaction of developing.

26. The dispenser of claim 25, wherein:

the rinse head waits for a predetermined dwell period after the developer head has dispensed the developer material before dispensing the rinse material.

27. The dispenser of claim 25, further comprising:

a suction head that moves in the substantially linear relative motion with respect to the photosensitive layer on the substrate and removes loose material on a surface of the substrate, wherein movement of the suction head is initiated at the first end of the substrate and is performed at the velocity and the suction head operates after operation of the developer head and prior to operation of the rinse head;

wherein said loose material comprises developer material and chemical reaction products.

28. The dispenser of claim 27, wherein:

the suction head operates until the loose material has been substantially removed.

29. The dispenser of claim 27, wherein:

the suction head is at a fixed distance with respect to the rinse head.

30. The dispenser of claim 25, wherein:

the developer head operates until developer material completely covers the photosensitive layer.

31. The dispenser of claim 25, wherein:

the rinse head operates until the chemical reaction of developing has been halted.

32. The dispenser of claim 25, further comprising:

a chuck that supports the substrate.

33. The dispenser of claim 32, further comprising:

a trough that encompasses the chuck for draining the rinsing material and developer material.

34. The dispenser of claim 32, further comprising:

a camera that is connected to the chuck for monitoring the substrate.

35. The dispenser of claim 34, wherein:

the camera is used for comparing a surface pattern of the substrate with a known surface pattern to determine whether the chemical reaction is substantially complete.

36. The dispenser of claim 35, wherein:

the camera examines a single point of the substrate.

37. The dispenser of claim 32, further comprising:

a catalyst for manipulating the chemical reaction.

38. The dispenser of claim 37, wherein the catalyst is ultrasonic energy, the dispenser further comprises:

an ultrasonic transducer that is coupled to the chuck;

wherein the ultrasonic energy is transmitted to the substrate by the ultrasonic transducer.

39. The dispenser of claim 25, further comprising:

a gantry structure for supporting the developer head and the rinse head during the movement of the developer head and the rinse head.

40. The dispenser of claim 25, further comprising:

a control system that controls the velocity, the first controlled rate, and the second controlled rate.

41. The dispenser of claim 25, further comprising:

means for changing a location of the substrate in a direction that is orthogonal to a direction of the substantially linear relative motion based on sensory information to maintain a substantially consistence distance between the substrate and the developer head.

42. The dispenser of claim 25, further comprising:

means for controlling the temperature of the chemical reaction.

43. The dispenser of claim 42, wherein the means for controlling the temperature comprises:

means for controlling the temperature of the substrate.

44. The dispenser of claim 42, wherein the means for controlling the temperature comprises:

means for controlling the temperature of the developer material; and means for controlling the temperature of the rinsing material.

45. The dispenser of claim 25, further comprising:

a first reservoir for the developer material; and a second reservoir for the rinsing material.

46. The dispenser of claim 45, wherein:

the developer material is recirculated in the first reservoir.

47. The dispenser claim 45, further comprising:

means for controlling the temperature of the developer material in the first reservoir.

48. The dispenser of claim 25, further comprising:

means for recovering unused and dispensed developer material from the step of dispensing the developer material; and means for recycling the developer material for use in a subsequently performed step of dispensing the developer material.

* * * * *